US007002215B1

(12) United States Patent
Miller

(10) Patent No.: US 7,002,215 B1
(45) Date of Patent: Feb. 21, 2006

(54) FLOATING ENTRANCE GUARD FOR PREVENTING ELECTRICAL SHORT CIRCUITS

(75) Inventor: David Miller, Louisville, CO (US)

(73) Assignee: PTS Corporation, San Jose, CA (US)

( * ) Notice: Subject to any disclaimer, the term of this patent is extended or adjusted under 35 U.S.C. 154(b) by 88 days.

(21) Appl. No.: 10/262,404

(22) Filed: Sep. 30, 2002

(51) Int. Cl.
*H01L 23/52* (2006.01)

(52) U.S. Cl. ............... 257/355; 257/356; 257/354; 257/357; 257/691; 257/758; 257/622; 257/664; 257/750; 257/776; 438/19; 438/125; 438/622; 438/652; 438/666

(58) Field of Classification Search ............... 257/355, 257/522, 254, 354, 356, 691, 758, 662, 664, 257/770, 776; 438/53, 54, 106, 108, 19, 438/125, 622, 652, 666
See application file for complete search history.

(56) References Cited

U.S. PATENT DOCUMENTS

| | | | |
|---|---|---|---|
| 5,212,582 A | | 5/1993 | Nelson |
| 5,600,383 A | | 2/1997 | Hornbeck |
| 5,847,381 A | * | 12/1998 | Isogai ............... 250/208.1 |
| 5,960,133 A | | 9/1999 | Tomlinson |
| 5,981,384 A | * | 11/1999 | Juengling ............... 438/666 |
| 6,028,689 A | | 2/2000 | Michalicek et al. |
| 6,040,935 A | | 3/2000 | Michalicek |
| 6,128,122 A | | 10/2000 | Drake et al. |
| 6,140,144 A | * | 10/2000 | Najafi et al. ............... 438/53 |
| 6,232,150 B1 | * | 5/2001 | Lin et al. ............... 438/119 |
| 6,307,657 B1 | | 10/2001 | Ford |
| 6,346,189 B1 | * | 2/2002 | Dai et al. ............... 205/766 |
| 6,352,933 B1 | * | 3/2002 | Forbes et al. ............... 438/703 |
| 6,437,432 B1 | * | 8/2002 | Ikumo et al. ............... 257/691 |
| 6,469,330 B1 | * | 10/2002 | Vigna et al. ............... 257/254 |
| 6,747,340 B1 | * | 6/2004 | Barnes et al. ............... 257/659 |
| 6,808,384 B1 | | 10/2004 | Jordan et al. |
| 2001/0021570 A1 | * | 9/2001 | Lin et al. ............... 438/455 |
| 2003/0173112 A1 | * | 9/2003 | Barnes et al. ............... 174/261 |
| 2003/0174929 A1 | * | 9/2003 | Roders et al. ............... 385/18 |

OTHER PUBLICATIONS

U.S. Appl. No. 10/216,600, filed Aug. 9, 2002, Anderson et al.
Akiyama, Terunobu et al., Controlled Stepwise Motion in Polysilicon Microstrutures, Journal of Microelectromechanical Systems, vol. 2, No. 1, Sep. 1, 1993, pp 106-110.
Ashruf, C.M.A. et al. Galvanic Porous Silicon Formation Without External Contracts, Elsevier Science S.A.., Sensors and Actuators 74 (1999), pp.. 118-122.

(Continued)

*Primary Examiner*—Nathan J. Flynn
*Assistant Examiner*—Fazli Erdem
(74) *Attorney, Agent, or Firm*—Townsend and Townsend and Crew LLP

(57) ABSTRACT

Methods and apparatuses are provided for protecting an interconnect line in a microelectromechanical system. The interconnect line is disposed over a substrate for conducting electrical signals, such as from a bonding pad to a mechanical component to effect movement as desired of the mechanical component. A first protective covering is disposed over a first portion of the interconnect line and a second protective covering is disposed over a second portion of the interconnect line. The first protective covering is provided in electrical communication with the substrate and the second protective covering is electrically isolated from the substrate.

44 Claims, 8 Drawing Sheets

OTHER PUBLICATIONS

Bean, Kenneth E., Anisotropic Etching of Silicon, IEEE Transactions on Electron Devices, vol. ED-25, No. 10, Oct. 1978, pp. 1185-1193.

Ciarlo, Dino R., A Latching Accelerometer Fabricated by the Anisotropic Etching of (110) Oriented Silicon Wafers, 1860-1317/92/010010+04104.50, Mar. 1992 IOP Publishing Ltd.

Dewa, Andrew S., et al., Development of a Silicon Two-Axis Micromirror for an Optical Cross-Connect, Solid-State Sensor and Actuator Workshop, Hilton Head Island, South Carolina, Jun. 4-6, 2000, pp. 93-96.

Ford, Joseph E. et al., Wavelength Add-Drop Switching Using Tilting Micromirrors, Journal of Lightwave Technology, vol. 17, No. 5, May 1999, pp. 904-911.

Grade, John D., et al., A Large-Deflection Electrostatic Actuator for Optical Switching Applications, Solid-State Sensor and Actuator Workshop, Hilton Head Island, South Carolina, Jun. 4-6, 2000, pp. 97-100.

Hopkins, Robert E., Some Thoughts on Lens Mounting, Optical Engineering, vol. 15, No. 5, Sep.-Oct. 1976, pp. 428-430.

Kaajakari, Ville, et al., Ultrasonic Actuation for MEMS Dormancy-Related Stiction Reduction, in MEMS Reliability for Critical Applications, Proceedings of SPIE vol. 4180, 2000, pp. 60-65.

Koch, T.L. et al., Anisotropically Etched Deep Gratings for InP/InGaAsP Optical Devices, Journal of Applied Physics 62 (8), Oct. 15, 1987, pp. 3461-3463.

Schilling, M. et al., Deformation-Free Overgrowth of Reactive Ion Beam Etched Submicron Structures in InP by Liquid Phase Epitaxy, Applied Physics Lett. 49 (12), Sep. 22, 1986, pp. 710-712.

Tang William C., et al., Electrostatically Balanced Comb Drive for Controlled Levitation, Reprinted from Technical Digest IEEE Solid-State Sensor and Actuator Workshop, Jun. 1990, pp. 198-202.

Torcheux, L. et al., Electrochemical Coupling Effects on the Corrosion of Silicon Samples in HF Solutions, J. Electrochem. Soc., vol. 142, No. 6, Jun. 1995, pp. 2037-2046.

Van Kessel, Peter F. et al., A MEMS-Based Projection Display, Proceedings of the IEEE, vol. 86, No. 8, Aug. 1998, pp. 1687-1704.

Keller, Christopher, Microfabricated Silicon High Aspect Ratio Flextures for In-Plane Motion, Dissertation submitted to University of California, Berkeley, Fall 1998.

Muller, Lilac, Gimballed Electrostatic Microactuators with Embedded Interconnects, Dissertation submitted to University of California, Berkeley, Spring. 2000.

* cited by examiner

FLOATING ENTRANCE GUARD FOR PREVENTING ELECTRICAL SHORT CIRCUITS

CROSS REFERENCE TO RELATED APPLICATION

This application is related to commonly assigned U.S. patent application Ser. No. 10/216,600, entitled "METHOD AND APPARATUS FOR PROTECTING WIRING AND INTEGRATED CIRCUIT DEVICE," filed Aug. 9, 2002 by Robert L. Anderson and David Reyes, the entire disclosure of which is incorporated herein by reference for all purposes.

BACKGROUND OF THE INVENTION

This application relates generally to microelectromechanical systems ("MEMS"). More specifically, this application relates to methods and systems for protecting interconnect structures in MEMS.

There are various known techniques for providing protective structures in the field of integrated circuits. For example, it is common to form an integrated-circuit structure through the deposition of various layers of materials and to complete the process by depositing a passivation layer over the resulting layered structure. Furthermore, the integrated circuits may also be capped with a plastic material to prevent their destruction. In the case of MEMS, protection of components is complicated by the existence of active mechanical components, which in some instances need to be exposed to the atmosphere for the device to operate as desired. In these applications, a passivation layer cannot be applied to the entire structure because it would interfere with the movement of the active mechanical components.

Thus, in MEMS packaging, conductors may sometimes be exposed to the atmosphere, permitting contamination by particulate matter that may interfere with the operation of the device. For example, a typical MEMS device includes a plurality of interconnect traces, with each trace being designed to connect to a single element of the device. The presence of contaminant debris between two (or more) traces may tie those traces together electrically so that they no longer connect to a single element. Even worse, the location of contaminant debris may electrically tie the trace to ground, resulting in a true electrical short circuit than renders the entire MEMS device nonfunctional. In some instances, the electrical short circuit may result in arcing, melting, or welding, causing destruction of the device.

Contaminant particles may arise from different sources. For example, they may occur as dirt particles that exist in the atmosphere in which the device is manufactured. Filtering techniques are used to limit the presence of dirt particles, but these techniques are imperfect. More typically, the manufacturing process itself results in fragments of silicon that are not completely removed during fabrication steps. This may occur, for example, during the removal of sacrificial material, resulting in contaminant "stringers." Also, handling of the devices may induce chipping or fracturing at the edges of the material.

There is, therefore, a general need in the art for methods and systems to mitigate the damage caused to MEMS devices resulting from electrical interference by contaminant particles.

BRIEF SUMMARY OF THE INVENTION

Embodiments of the invention provide methods and apparatuses for protecting an interconnect line in a microelectromechanical system. The interconnect line is disposed over a substrate for conducting electrical signals, such as from a bonding pad to a mechanical component to effect movement as desired of the mechanical component. A first protective covering is disposed over a first portion of the interconnect line and a second protective covering is disposed over a second portion of the interconnect line. The first protective covering is provided in electrical communication with the substrate and the second protective covering is electrically isolated from the substrate. Suitable materials for the protective coverings include polysilicon. The electrical communication between the first protective covering and the substrate permits establishing an equipotential ring around the interconnect line. Since the second protective covering is not in electrical communication with the substrate, it has a floating electric potential and acts as an entrance guard for the interconnect shield. In some instances, the substrate may be in electrical communication with the bonding pad such that the equipotential ring comprises a ground ring.

In some embodiments, an electrically insulative barrier may also be included between the interconnect line and the substrate. Electrical communication between the first protective covering and the substrate may thus be achieved by including one or more openings in the barrier layer.

In other embodiments, a third protective covering may be disposed over a third portion of the interconnect line, with the third protective covering being electrically isolated from the substrate. Where the first protective covering is disposed between the second and third protective coverings, the second and third protective coverings function as floating entrance guards on either end of the equipotential portion of the interconnect shield. The effectiveness of these floating entrance guards may be improved by configuring them so that longitudinal end regions have smaller heights above the interconnect line than a central region. Gaps that exist between the first and second protective coverings or between the first and third protective coverings may be covered by a protective jacket.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and is enclosed in parentheses to denote one of multiple similar components. When reference is made to a reference numeral without specification to an existing sublabel, it is intended to refer to all such multiple similar components.

DETAILED DESCRIPTION OF THE INVENTION

Embodiments of the invention use an interconnect shield to prevent contaminant particles from interfering with the electrical operation of the interconnect structure that it shields. The protection of the interconnect shield is enhanced in some embodiments by having the interconnect shield include a first portion maintained at a specific electric potential through the formation of an equipotential ring and a second portion whose electric potential is permitted to float. In some instances, the equipotential portion is also electrically coupled with a circuit ground, such as to a bonding pad that is coupled to the circuit ground, so that the equipotential ring corresponds to a ground ring. Grounding the equipotential portion has the advantage of generally reducing electrical attraction of contaminant particles to the interconnect shield. Reference to an "equipotential" ring is intended to mean that the electric potential is substantially constant throughout the ring. It is recognized that because of the resistive properties of some materials, the electric potential may have some negligible variation throughout the ring; such negligible variations introduced by the materials used are not considered to take such structures out of the definition of an equipotential ring, as would be understood by those of skill in the art.

In the following description of the structures used for the interconnect shield and for methods of forming the interconnect shield, reference is sometimes made to the relative positions of material layers, with one layer being identified as "over" another layer. Such references are not intended to require that the layers be adjacent, although they may be in some embodiments. In other embodiments, there may be additional intermediate layers separating the referenced layers.

Figure 1A:
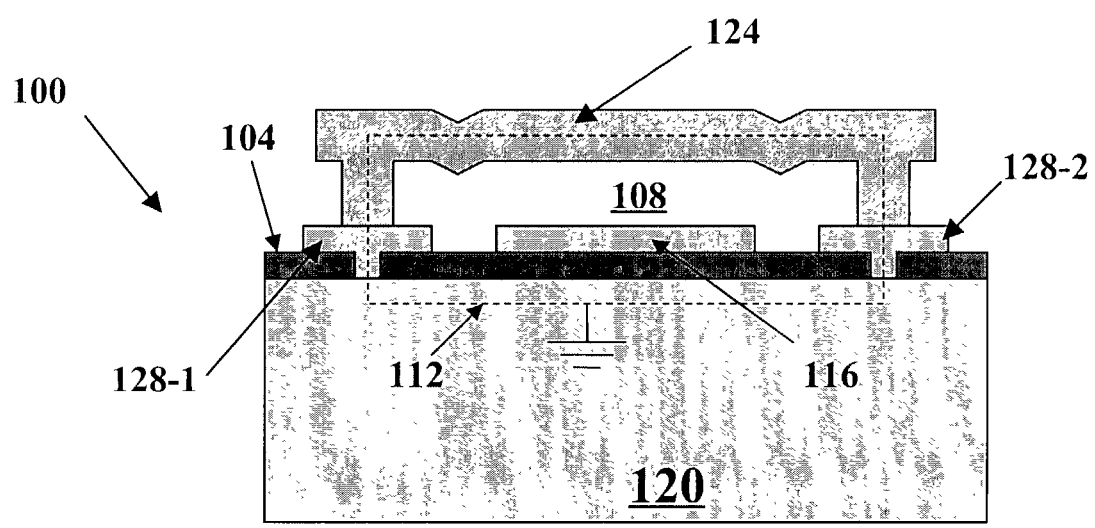
FIG. 1A is a cross-sectional view of a portion of an interconnect shield made in accordance with an embodiment of the invention.

The basic use of an interconnect shield is illustrated in FIG. 1A, which shows an intermediate MEMS structure 100 prior to performing release. The MEMS structure is formed over a substrate 120, which is typically made of silicon although the principles of the invention are effective for any electrically conductive material. Over the substrate is a barrier layer 104 that is formed of an electrically insulative material, such as an oxide and/or a nitride; in specific embodiments, the barrier layer 104 comprises SiN. The barrier layer 104 includes openings that permit the completion of an equipotential ring as described below.

The interconnect line 116 is provided over the barrier layer 104 and is formed with an electrically conductive material. A suitable material for the interconnect line 116 comprises polysilicon, although any electrically conductive material may alternatively be used, including metals. The general function of the interconnect line 116, which runs perpendicularly to the page, is to conduct electrical signals within the MEMS device from a bonding pad on a chip to the input of an active mechanical component. At each of the openings within the barrier layer 104, support stacks 128 are included to provide structural support for a protective covering 124 erected around the interconnect line 116. Both the support stacks 128 and the protective covering 124 are formed of an electrically conductive material, such as polysilicon, and the material of the support stacks 128 fills the openings in the barrier layer 104 to contact the substrate 120. FIG. 1A also shows the presence of insulating material 108 between the interconnect line 116 and protective covering 124. Such insulating material 108 typically comprises sacrificial material used as part of a manufacturing process, described in greater detail below, and is usually removed during a subsequent release step; in other embodiments, however, it may by used to provide an insulative sheath around the interconnect line 116 that also provides additional structural support to the protective covering 124.

The configuration of the structure shown in FIG. 1A results in the establishment of an equipotential ring 112, shown as a ground ring. An equipotential circuit 112 around the interconnect line 116 is produced because there is contact between the conductive substrate 120, the conductive support stacks 128, and the conductive protective covering 124. In addition to the structural protections provided by the interconnect shield, the equipotential ring 112 ensures that any contaminant particles that fall onto the protective covering 124 are exposed only to the reference equipotential. In addition, surrounding the interconnect line 116 with the equipotential ring 112 helps mitigate the effects that external electrical noise could otherwise have on the signal carried by the interconnect line 116.

Figure 1B:
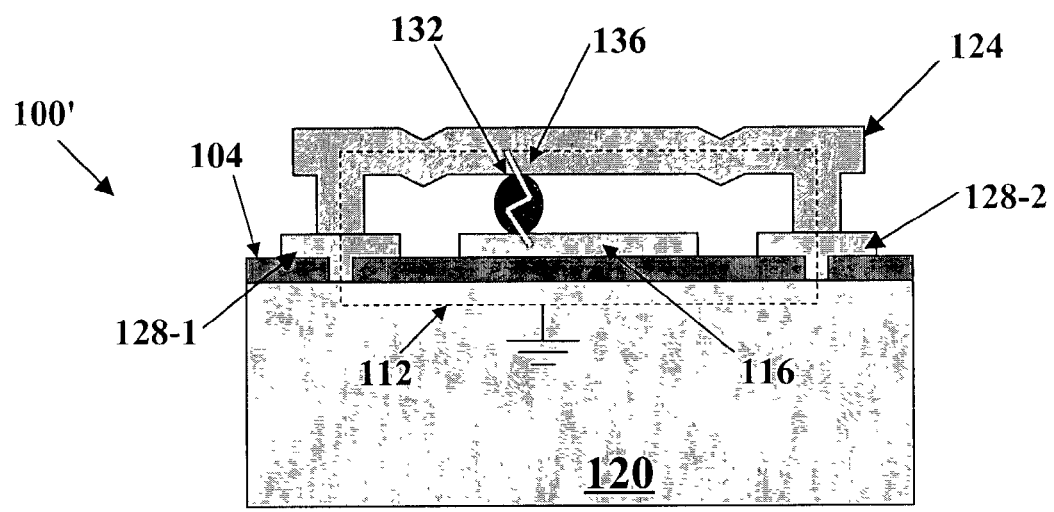
FIG. 1B is a cross-sectional view illustrating the effect of a contaminant particle present at a longitudinal end of the interconnect shield.

In those instances where the insulating material 108 is removed, there is a possibility at the longitudinal ends of the interconnect shield that a contaminant particle may become situated between the protective covering 124 and the interconnect line 116, as shown in cross-section view in FIG. 1B. In FIG. 1B, the interconnect shield is denoted 100' and differs from the interconnect shield 100 shown in FIG. 1A in that the insulting material 108 is not present, such as by having been removed with a release procedure. The presence of the contaminant particle 132 between the protective covering 124 and the interconnect line 116 may cause an electrical short if the contaminant particle is electrically conductive, as would be the case for a stringer resulting from a MEMS fabrication process.

According to embodiments of the invention, such electrical shorts at a longitudinal end of the interconnect shield are avoided by providing an entrance-guard portion to the interconnect shield that is electrically floating. Such an entrance-guard portion is provided at either or both longitudinal ends of the interconnect shield and is not restricted to a particular electrical potential, thereby avoiding a short circuit even when debris accumulates at the entrance guard region. The remainder of the interconnect line remains protected by the equipotential portion the interconnect shield. It is generally preferred that the longitudinal extent of the floating entrance-guard portions be small in comparison with the longitudinal extent of the equipotential portion to prevent the accumulation of a large capacitive charge. In addition to the specific embodiments described herein, a number of the structural and/or functional features described in Anderson may be adapted for use with the equipotential and/or floating portions of the interconnect shield.

Figure 2:
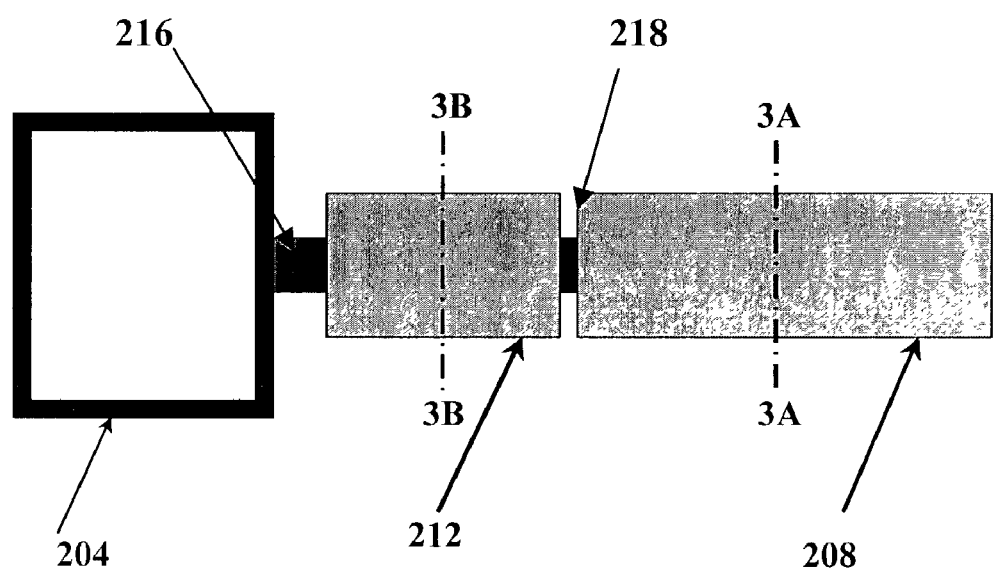
FIG. 2 is a top view of a portion of a MEMS device illustrating the use of an interconnect shield having an equipotential portion and a floating portion.

A plan view is provided in FIG. 2 of one configuration of an interconnect shield that includes both a floating entrance-guard portion 212 and an equipotential portion 208. The term "interconnect shield" is used to refer to the floating and equipotential portions collectively, although these portions may be separated by a gap 218 as shown in FIG. 2. The floating and equipotential portions of the interconnect shield protect the interconnect line 216, which is shown extending from a bond pad 204. While FIG. 2 shows only a single floating portion 212 at an end of the interconnect shield proximal to the bond pad 204, there may be another floating portion at an end of the interconnect shield distal from the bond pad 204, i.e. towards an active mechanical component of a MEMS device. Such a second floating portion may also be separated from the equipotential portion 208 by a gap. As illustrated by FIG. 2, it is not necessary that the interconnect shield extend along the entire length of the interconnect line 216 to achieve the benefits discussed herein. Rather, the interconnect shield may be configured to extend along a substantial portion of the of the interconnect line 216, cover 50% or more, or even 70%, 90%, or 95% of the length of the interconnect line 216.

Figure 3A:
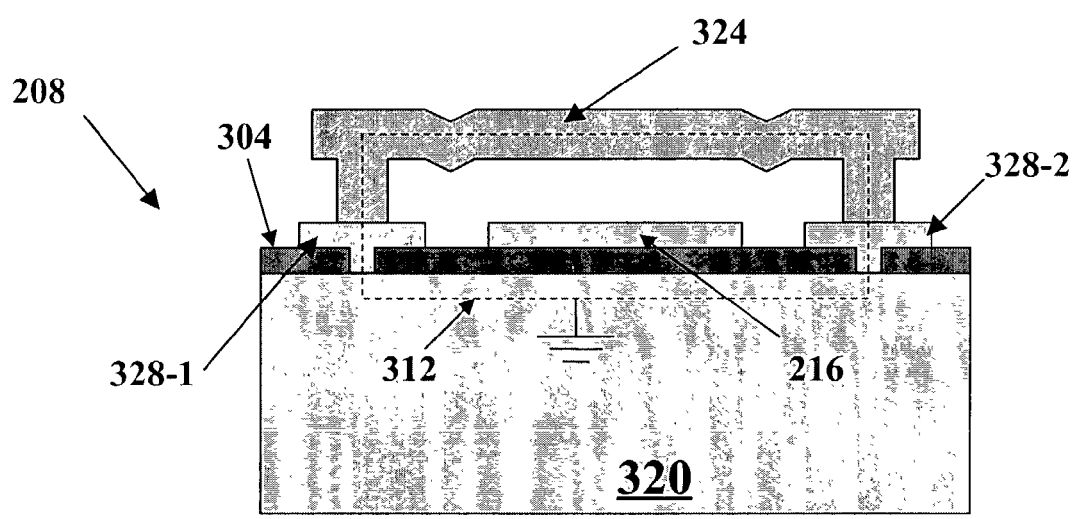
FIG. 3A is a cross-sectional view of an equipotential portion of an interconnect shield in one embodiment.
Figure 3B:
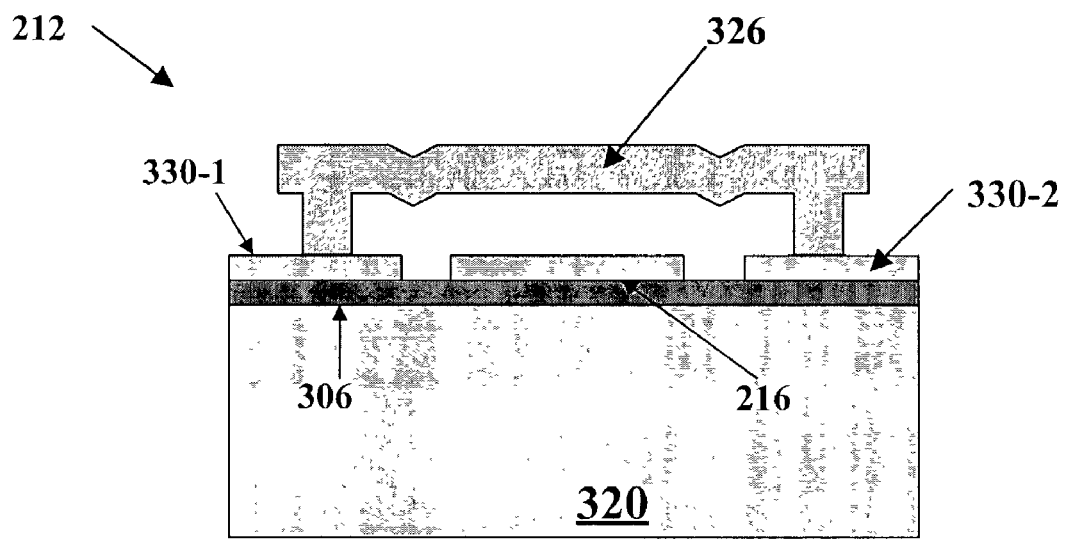
FIG. 3B is a cross-sectional view of a floating portion of an interconnect shield in one embodiment.

FIGS. 3A and 3B respectively show cross-sectional views of the equipotential portion 208 and floating portion 212 of the interconnect shield in one embodiment. Common to the two cross-sectional views are the substrate 320 over which the interconnect shield is formed and the interconnect line 216 that is protected. Each portion of the interconnect shield in the embodiment illustrated with FIGS. 3A and 3B comprises similar components that are distinguished with the labels "first" and "second" in describing their respective arrangements.

Thus, the equipotential portion 208 shown in FIG. 3A has a structure similar to that described with respect to FIG. 1A with no insulating material between the interconnect line 216 and the first protective covering 324. The first support stacks 328, which support the first protective covering 324, are in electrical communication with the underlying substrate 320 through openings in the electrically insulative first barrier layer 304. The interconnect line 316 is positioned between the first support stacks 328 over the first barrier layer 304 so that it is encapsulated by the first protective covering 324. The substrate 320, first support stacks 328, and first protective covering 324 each comprise electrically conductive material, such as polysilicon, so that an equipotential ring 312 is defined to surround the interconnect line 216.

The floating portion 212 shown in FIG. 3B differs from the equipotential portion 208 primarily in the use of the electrically insulative second barrier layer 306 to prevent electrical communication between the second protective covering 326 and the substrate 320. This is achieved by providing a second barrier layer 306 that is free of openings, at least where it contacts the second support stacks 330. The second barrier layer 306 is provided between the substrate 320 and the second support stacks 330, which are used to support the second protective covering 326. The second protective covering 326 is thus electrically isolated from the substrate 320 by the presence of the gap 218 between the two portions of the interconnect shield and the second barrier layer 306. The gap 218 ensures at least that the first and second protective coverings 324 and 326, and the first and second support stacks 328 and 330, are noncontiguous. The first and second barrier layers 304 and 306 may either be contiguous or noncontiguous, provided that only the first barrier layer 304 includes openings that permit electrical communication between the first support stacks 328 and the substrate 320.

Figure 4A:
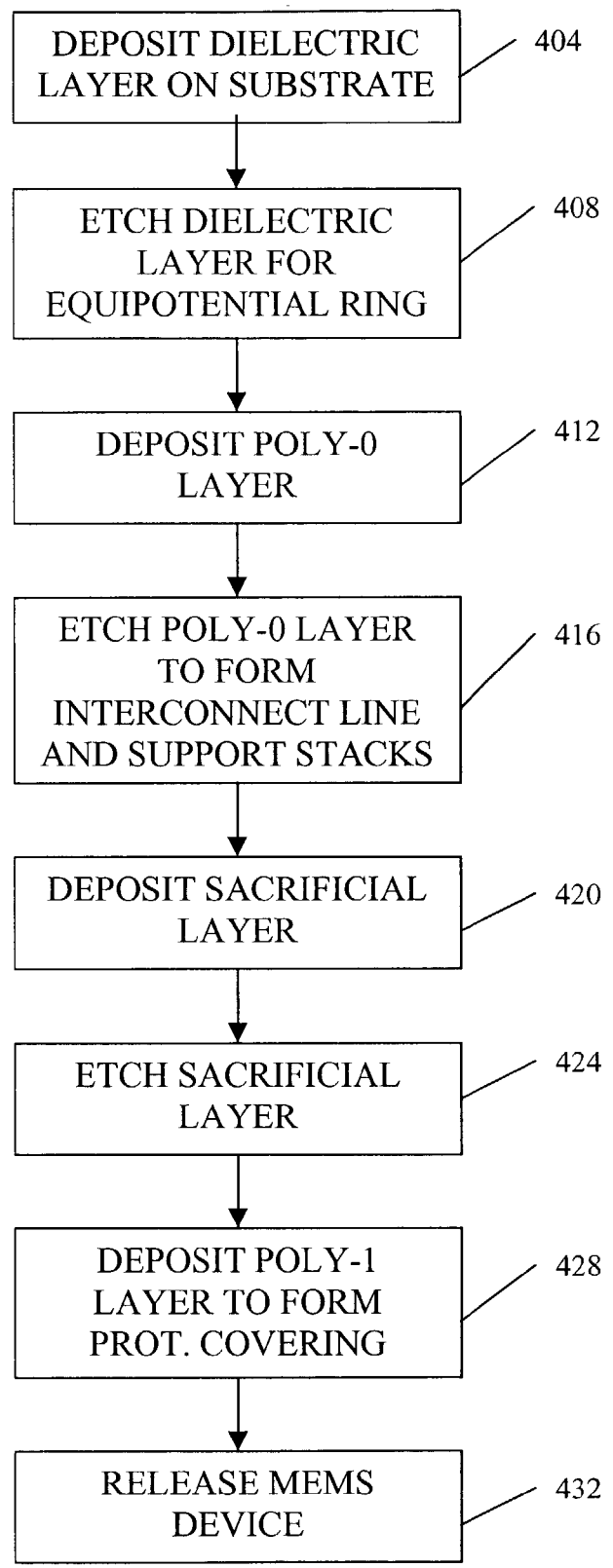
FIG. 4A is a flow diagram illustrating a method for forming an equipotential portion of an interconnect shield in an embodiment.
Figure 4B:
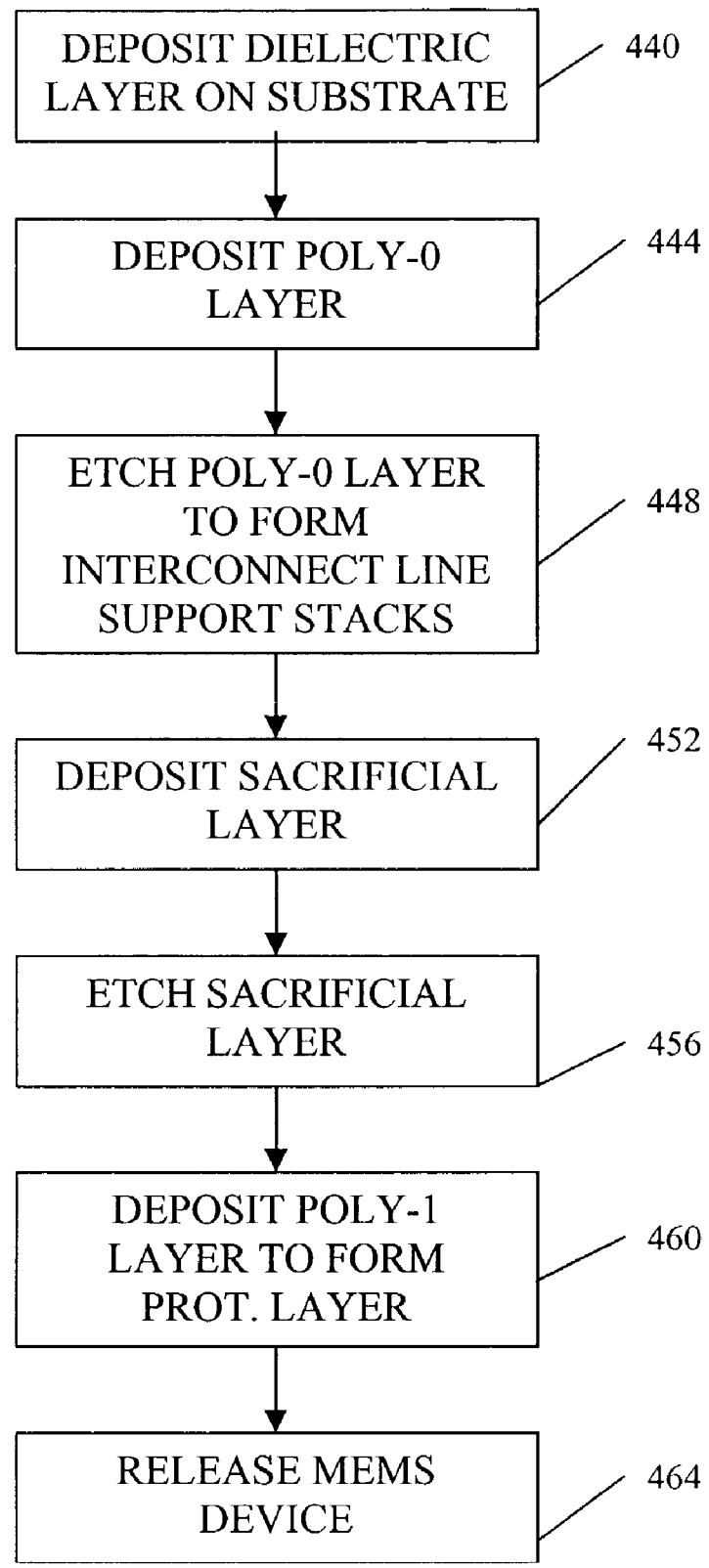
FIG. 4B is a flow diagram illustrating a method for forming a floating portion of an interconnect shield in an embodiment.

There are a variety of methods that may be used to form the interconnect shield. FIGS. 4A and 4B respectively set forth exemplary methods for forming the equipotential and floating portions. Each of the methods begins with a substrate, usually a common substrate for the two portions. The methods include subsequent steps of deposition and etching. In one embodiment, layers of polysilicon may be built up in successive steps; these layers are conventionally identified as poly-0, poly-1, poly-2, . . . layers, with the poly-0 layer corresponding to the lowest polysilicon layer, poly-1 to the next higher polysilicon layer, etc. The depositions and etching may be performed using any suitable technique known to those of skill in the art. For example, the depositions may be performed using epitaxy, chemical-vapor deposition (including atmospheric-pressure chemical-vapor deposition, low-pressure chemical vapor deposition, plasma-enhanced chemical-vapor deposition, high-density-plasma chemical vapor deposition, and electron-cyclotron-resonance chemical vapor deposition, among others), spin-on methods, sol-gel methods, bonding methods, or any other suitable deposition method. The etchings may be performed using wet isotropic etching, plasma etching, reactive-ion etching, deep reactive-ion etching, or any other suitable etching method. The etchings may be done selectively by using a known patterning technique, such as optical lithography.

As shown in FIG. 4A, formation of the equipotential portion 208 begins at block 404 by depositing a dielectric layer on the substrate that will function as the first barrier layer 306. This dielectric layer may comprise any suitable electrically insulative material. In one embodiment, the dielectric layer comprises an oxide or a nitride, such as SiN. At block 408, the dielectric layer is etched to produce the openings in the first barrier layer 306 through which the equipotential ring 312 is produced. At block 412, a first conductive layer of material is deposited that will correspond functionally to the interconnect line 216 and support stacks 328. In one embodiment, this first conductive layer comprises a poly-0 layer. At block 416, the first conductive layer is etched to distinguish the support stacks 328 and interconnect line 216. Sacrificial material is deposited at block 420 as an intermediate stage in preparation for forming the protective covering 324. The sacrificial material may comprise any material that may be removed without also removing the structural layers; in one embodiment, the sacrificial material comprises $SiO_2$. At block 424, the sacrificial material is etched to define the desired shape for the protective covering 324. At block 428, a second conductive layer of material is deposited that corresponds to the protective covering 324. In one embodiment, this second conductive layer comprises a poly-1 layer. It will, however, be apparent to those of skill in the art that the second conductive layer may alternative comprise a layer successive to a poly-1 layer.

Application of this sequence of blocks 404–428 results in the formation of a structure like that shown in FIG. 1A. It will be appreciated that in the fabrication of a MEMS device, this sequence will also be accompanied by additional steps used in fabricating mechanical components and additional interconnect lines to be used in the MEMS device. Once the sequence of deposition and etching steps is completed, including both those to form the functional components of the MEMS device and those shown in FIG. 4A to produce the equipotential portion of the interconnect shield, the MEMS device is released at block 432. The release may be effected by exposure to a substance that removes the sacrificial material, such as by exposure to HF where the sacrificial material comprises $SiO_2$.

FIG. 4B is similar to FIG. 4A, reflecting the similarity in structures of the equipotential portion 208 and the floating portion 212 of the interconnect shield. In most instances, fabrication of the floating portion 212 may take place in parallel with fabrication of the equipotential portion 208, even to the extent of sharing some of the steps in FIGS. 4A and 4B. For example, at block 440 of FIG. 4B, a dielectric layer is deposited on the substrate 320, which will function as the second barrier layer 306. As for fabrication of the equipotential portion 208, this dielectric barrier layer may comprise an oxide or a nitride, such as SiN. Accordingly, block 440 may be performed simultaneously with block 404 of FIG. 4A to deposit a single dielectric barrier layer that extends longitudinally through the regions of both the equipotential and floating portions 208 and 212. In embodiments where the gap 218 between the equipotential and floating portions 208 and 212 includes a separation between the first and second barrier layers 304 and 306, the etching at block 408 of FIG. 4A may include etching such a separation. Generally, the dielectric barrier layer is not etched when forming the floating portion 212 (as contrasted with the formation of the equipotential portion 208) since the second protective covering 326 is to be electrically isolated from the substrate 320.

Similarly, when a first conductive layer (such as a poly-0 layer) is deposited at block 444 of FIG. 4B in fabricating the floating portion 212, this deposition may be performed simultaneously with the deposition of the first conductive layer at block 412 of FIG. 4A. At block 448, the first conductive layer is etched to separate it into distinct support stacks 330 and interconnect line 316. If depositions are performed simultaneously at blocks 412 of FIGS. 4A and 444 of FIG. 4B, the etching at block 448 may additionally separate the first support stacks 328 from the second support stacks 332 as part of forming the gap 218 between the equipotential and floating portions 208 and 212. As discussed above, this separation contributes to the electrical isolation of the first and second protective coverings 324 and 326. Generally, the interconnect line 316 will not be etched along the longitudinal direction since a continuous interconnect line 316 is desirable for operating mechanical components of the completed MEMS device.

The second protective structure is formed with the sequence of blocks 452, 456, and 460 of depositing sacrificial material, such as $SiO_2$, etching the sacrificial material and depositing a second conductive layer, which may be a poly-1 layer. This sequence is similar to the sequence of blocks 420, 424, and 428 in FIG. 4A and may, in some embodiments, be performed simultaneously with those blocks. In instances where they are performed simultaneously, an additional etching may be performed to separate the first and second protective covers 324 and 326 so that they are electrically isolated. In addition to being performed simultaneously with portions of FIG. 4A, blocks 440–460 of FIG. 4B are also generally performed simultaneously with steps to produce the mechanical components of the MEMS device. Accordingly, at block 464, the MEMS device is released, such as by exposure to HF to dissolve sacrificial material deposited as part of the process.

In the embodiments described above, the floating entrance-guard portion 212 of the interconnect shield provides protection against contaminant particles that are larger than any of its openings. Expressed differently, for a contaminant particle to pass by the floating entrance-guard portion 212 and interfere in the manner described with respect to FIG. 1B, it must be smaller than any openings around the floating portion 212. These openings exist at both longitudinal ends of the floating portion 212 and may be reduced in size with a number of different techniques, thereby improving the effectiveness of the interconnect shield.

Practical fabrication limitations limit how low an approximately uniform height of the second protective covering 326 may be above the interconnect line. Accordingly, in one embodiment, a longitudinal end region of the second protective covering 326 has a smaller height above the interconnect line 216 than an approximately uniform height of a longitudinally central region of the second protective covering 326. One technique that may be used to achieve such a smaller height at a longitudinal end region is a dimple-cut technique, in which the profile of the second protective covering 326 is provided with a downwards protrusion at the longitudinal end region. In a fabrication process, this may be achieved by performing a partial etch of an insulating layer between the interconnect-line layer and the protective covering layer at the end region and subsequently etching to this additional polysilicon layer at the end region. In different embodiments, the dimple cut may be included at one or both longitudinal end regions of the second protective covering 326; it is expected that the dimple cut will more usually be included at least at the end region opposite from the equipotential portion 208.

Figure 5A:
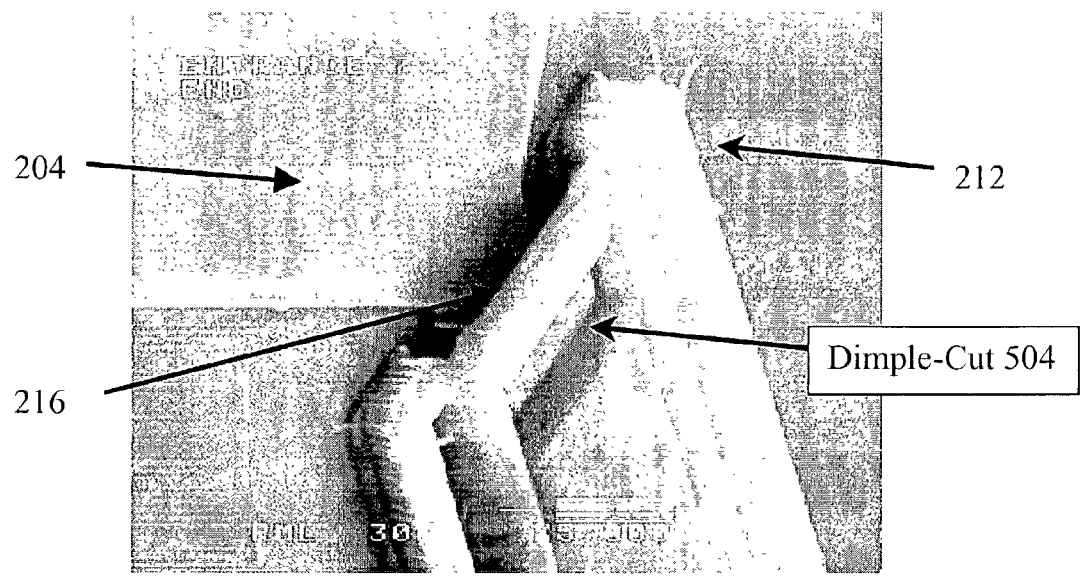
FIG. 5A is a scanning electron micrograph of a floating portion of an interconnect shield in one embodiment.

An example of such a dimple cut 504 is provided in FIG. 5A, which is a scanning electron micrograph of a floating portion 212 of an interconnect shield that has been manufactured according to the methods described herein. The micrograph shows the interconnect line 216 being shielded and the bond pad 204 from which it originates, in addition to the dimple cut 504 in the end region of the second protective covering. In the example shown in FIG. 5A, the height of the central region of the floating portion 212 above the interconnect line 216 is approximately 1.8 $\mu$m and the height of the end portion where the dimple cut 504 is located is approximately 0.65 $\mu$m. Since the dimple cut provides a smaller separation between the interconnect line 216 and the protective covering, only very small contaminant particles can pass through the end region.

Figure 5B:
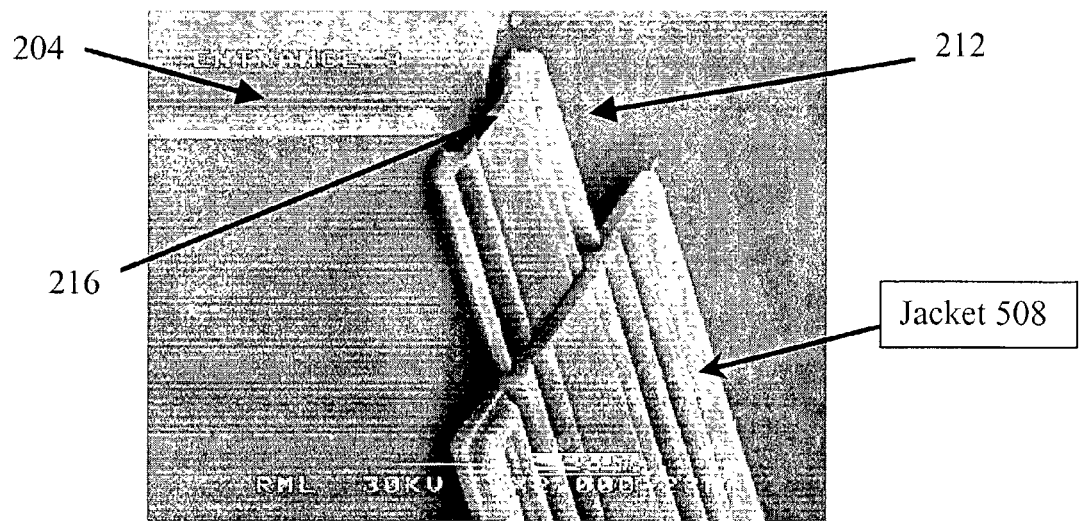
FIG. 5B is a scanning electron micrograph of a jacket formed over a gap between equipotential and floating portions of an interconnect shield.

For similar reasons, it is also desirable to keep the gap 218 between the equipotential portion 208 and the floating portion 212 of the interconnect shield small to prevent the longitudinal travel of contaminant particles. In some embodiments, this gap 218 is itself protected with a protective jacket structure formed over the gap. Such a protective jacket may be formed in manner similar to that for the protective coverings, but will have generally larger dimensions. An example of such a protective jacket 508 is provided in FIG. 5B, which is a scanning electron micrograph of a part of a MEMS device that includes an interconnect shield and a protective jacket 508. As in the micrograph of FIG. 5A, both the interconnect line 216 being shielded and the bond pad 204 from which it originates are visible. A first end region of the second protective covering 212 is visible near the bond pad 204; the other end region of the second protective covering 212 and the first protective covering 208 are hidden by the protective jacket.

Having described several embodiments, it will be recognized by those of skill in the art that various modifications, alternative constructions, and equivalents may be used without departing from the spirit of the invention. For example, while embodiments have been illustrated in which a single interconnect line is covered with a single interconnect shield, it is alternatively possible for a single interconnect shield to be used to cover multiple interconnect lines. In addition, in some embodiments, a MEMS device may be provided in which some of the interconnect lines are protected with interconnect shields while other interconnect lines are not. Accordingly, the above description should not be taken as limiting the scope of the invention, which is defined in the following claims.

What is claimed is:

1. A method for protecting an interconnect line disposed over a substrate to conduct electrical signals in a microelectromechanical system, the method comprising:
forming a first protective covering over a first portion of the interconnect line, wherein the first protective covering is in electrical communication with the substrate; and
forming a second protective covering over a second portion of the interconnect line, wherein the second protective covering is electrically isolated from the substrate,
wherein the interconnect line and at least one of the first and second protective coverings are separated only by atmosphere.

2. The method recited in claim 1 wherein the first protective covering and the interconnect line are separated only by atmosphere.

3. The method recited in claim 1 wherein the second protective covering and the interconnect line are separated only by atmosphere.

4. The method recited in claim 1 further comprising forming an electrically insulative barrier layer between the interconnect line and the substrate, wherein the barrier layer includes a first opening through which the first protective covering communicates electrically with the substrate.

5. The method recited in claim 4 wherein the barrier layer includes a second opening through which the first protective covering communicates electrically with the substrate, whereby an equipotential ring is formed around the interconnect line.

6. The method recited in claim 1 wherein the first and second protective coverings comprise polysilicon.

7. The method recited in claim 1 further comprising forming a third protective covering over a third portion of the interconnect line, wherein the third protective covering is electrically isolated from the substrate.

8. The method recited in claim 7 wherein the first protective covering is positioned longitudinally along the interconnect line between the second and third protective coverings.

9. The method recited in claim 8 further comprising:
forming a first protective jacket over a gap between the first and second protective coverings; and
forming a second protective jacket over a gap between the first and third protective coverings.

10. The method recited in claim 1 wherein a longitudinal end region of the second protective covering has a smaller height above the interconnect line than a central region of the second protective covering.

11. The method recited in claim 1 wherein longitudinal end regions of the second protective covering have smaller heights above the interconnect line than a central region of the second protective covering.

12. The method recited in claim 1 further comprising forming a protective jacket over a gap between the first and second protective coverings.

13. An interconnect shield for protecting an interconnect line disposed over a substrate to conduct electrical signals in a microelectromechanical system, the interconnect shield comprising:
a first protective covering disposed over a first portion of the interconnect line, wherein the first protective covering is in electrical communication with the substrate; and
a second protective covering disposed over a second portion of the interconnect line, wherein the second protective covering is electrically isolated from the substrate, wherein the interconnect line and at least one of the first and second protective coverings are separated only by atmosphere.

14. The interconnect shield recited in claim 13 wherein the first protective covering and the interconnect line are separated only by atmosphere.

15. The interconnect shield recited in claim 13 wherein the second protective covering and the interconnect line are separated only by atmosphere.

16. The interconnect shield recited in claim 13 further comprising an electrically insulative barrier layer disposed between the interconnect line and the substrate, wherein the barrier layer includes a first opening through which the first protective covering communicates electrically with the substrate.

17. The interconnect shield recited in claim 16 wherein the barrier layer includes a second opening through which the first protective covering communicates electrically with the substrate, whereby an equipotential ring is formed around the interconnect line.

18. The interconnect shield recited in claim 13 wherein the first and second protective coverings comprise polysilicon.

19. The interconnect shield recited in claim 13 further comprising a third protective covering disposed over a third portion of the interconnect line, wherein the third protective covering is electrically isolated from the substrate.

20. The interconnect shield recited in claim 19 wherein the first protective covering is positioned longitudinally along the interconnect line between the second and third protective coverings.

21. The interconnect shield recited in claim 20 further comprising:
a first protective jacket disposed over a gap between the first and second protective coverings; and
a second protective jacked disposed over a gap between the first and third protective coverings.

22. The interconnect shield recited in claim 13 wherein a longitudinal end region of the second protective covering has a smaller height above the interconnect line than a central region of the second protective covering.

23. The interconnect shield recited in claim 13 wherein longitudinal end regions of the second protective covering have smaller heights above the interconnect line than a central region of the second protective covering.

24. The interconnect shield recited in claim 13 further comprising a protective jacket disposed over a gap between the first and second protective coverings.

25. A method for fabricating a microelectromechanical system, the method comprising:
forming a bonding pad over an electrically conductive substrate;
forming a mechanical component over the substrate, wherein the mechanical component is adapted to engage in movement relative to the substrate;
forming an electrically conductive interconnect line along a longitudinal line between the bonding pad and the mechanical component;

forming a first protective covering over a first portion of the interconnect line, wherein the first protective covering is electrically conductive and is in electrical communication with the substrate; and forming a second protective covering over a second portion of the interconnect line, wherein the second protective covering is electrically isolated from the substrates wherein the interconnect line and at least one of the first or second protective coverings are separated only by atmosphere.

26. The method recited in claim 25 further comprising forming an electrically insulative barrier layer between the interconnect line and the substrate.

27. The method recited in claim 25 further comprising electrically coupling the first protective covering with the substrate to configure an equipotential ring around the interconnect line.

28. The method recited in claim 27 further comprising electrically coupling the substrate with the bonding pad, whereby the equipotential ring comprises a ground ring.

29. The method recited in claim 25 further comprising forming a third protective covering over a third portion of the interconnect line, wherein the third protective covering is electrically isolated from the substrate and wherein the first protective covering is disposed along the longitudinal line between the second and third protective coverings.

30. The method recited in claim 25 wherein a longitudinal end region of the second protective covering has a smaller height above the interconnect line than a central region of the second protective covering.

31. The method recited in claim 25 further comprising forming a protective jacket over a gap between the first and second protective coverings.

32. A microelectromechanical device comprising:
an electrically conductive substrate;
a bonding pad disposed over the substrate;
a mechanical component disposed over the substrate, wherein the mechanical component is adapted to engage in movement relative to the substrate;
an electrically conductive interconnect line disposed over the substrate along a longitudinal line between the bonding pad and the mechanical component;
a first protective covering disposed over a first portion of the interconnect line, wherein the first protective covering is electrically conductive and is in electrical communication with the substrate; and
a second protective covering disposed over a second portion of the interconnect line, wherein the second protective covering is electrically isolated from the substrate
wherein the interconnect line and at least one of the first and second protective coverings are separated only by atmosphere.

33. The microelectromechanical device recited in claim 32 further comprising an electrically insulative barrier layer disposed between the interconnect line and the substrate.

34. The microelectromechanical device recited in claim 32 wherein the first protective covering is electrically coupled with the substrate to configure an equipotential ring around the interconnect line.

35. The microelectromechanical device recited in claim 34 wherein the substrate is electrically coupled with the bonding pad.

36. The microelectromechanical device recited in claim 32 further comprising a third protective covering disposed over a third portion of the interconnect line, wherein the third protective covering is electrically isolated from the substrate and wherein the first protective covering is disposed along the longitudinal line between the second and third protective coverings.

37. The microelectromechanical device recited in claim 32 wherein a longitudinal end region of the second protective covering has a smaller height above the interconnect line than a central region of the second protective covering.

38. The microelectromechanical device recited in claim 32 further comprising a protective jacket disposed over a gap between the first and second protective coverings.

39. An interconnect shield for protecting an interconnect line disposed over a substrate to conduct electrical signals in a microelectromechanical system, the interconnect shield comprising:
first protective means for covering a first portion of the interconnect line, wherein the first protective means is in electrical communication with the substrate; and
second protective means for covering a second portion of the interconnect line, wherein the second protective means is electrically isolated from the substrate, wherein the interconnect line and at least one of the first and second protective means are separated only by atmosphere.

40. The interconnect shield recited in claim 39 further comprising barrier means for electrically insulating the interconnect line from the substrate.

41. The interconnect shield recited in claim 39 wherein the first protective means is electrically coupled with the substrate to configure an equipotential ring around the interconnect line.

42. The interconnect shield recited in claim 39 further comprising third protective means for covering a third portion of the interconnect line, wherein the third protective means is electrically isolated from the substrate and wherein the first protective means is disposed between the second and third protective means.

43. The interconnect shield recited in claim 39 wherein a longitudinal end region of the second protective means has a smaller height above the interconnect line than a central region of the second protective means.

44. The interconnect shield recited in claim 39 further comprising fourth protective means for covering a gap between the first and second protective means.

* * * * *